United States Patent
Mitchell et al.

(10) Patent No.: US 10,251,315 B1
(45) Date of Patent: Apr. 2, 2019

(54) APPARATUSES AND METHODS FOR COOLING HIGH DENSITY ARRAYS OF NON-VOLATILE MEMORY MASS STORAGE DEVICES

(71) Applicant: Sanmina Corporation, San Jose, CA (US)

(72) Inventors: Matthew Phillip Mitchell, Colorado Springs, CO (US); Eugene McCabe, Fremont, CA (US); Ritesh Kumar, Colorado Springs, CO (US); Donald Chong Lee, Colorado Springs, CO (US); Franz Michael Schuette, Colorado Springs, CO (US)

(73) Assignee: SANMINA CORPORATION, San Jose, CA (US)

( * ) Notice: Subject to any disclaimer, the term of this patent is extended or adjusted under 35 U.S.C. 154(b) by 0 days.

(21) Appl. No.: 15/959,127

(22) Filed: Apr. 20, 2018

Related U.S. Application Data

(60) Provisional application No. 62/488,049, filed on Apr. 20, 2017.

(51) Int. Cl.
*G06F 1/20* (2006.01)
*H05K 7/20* (2006.01)

(52) U.S. Cl.
CPC ........... *H05K 7/20745* (2013.01); *G06F 1/20* (2013.01)

(58) Field of Classification Search
CPC ........... H05K 7/20836; H05K 7/20745; H05K 7/20736; H05K 7/20781; H05K 7/20763; H05K 7/20145; H05K 7/20718; H05K 7/20727; H05K 7/20554; H05K 5/0004; H05K 7/20209; H05K 7/20; H05K 7/20009; H05K 7/20136; H05K 7/20772; H05K 7/20809; G06F 1/20
USPC ............... 165/80.2, 104.33, 104.34, 247, 59; 454/184, 254, 339; 361/679.46, 679.47, 361/692, 679.48, 694, 690, 679.01, 679.5; 312/223.2, 236
See application file for complete search history.

(56) References Cited

U.S. PATENT DOCUMENTS

2013/0100610 A1* 4/2013 Schneider .......... H05K 7/20145
361/690

* cited by examiner

*Primary Examiner* — Mandeep S Buttar
(74) *Attorney, Agent, or Firm* — Loza & Loza, LLP; Julio M. Loza; Heidi L. Eisenhut

(57) ABSTRACT

One feature pertains to cooling of a high density array of non-volatile memory mass storage devices within a computer enclosure. A coolant is moved through the enclosure through two separate air paths, each serving approximately half of the mass storage devices. The two air paths are interleaved in a central duct ported to a frontal and a rear plenum. The central duct contains two groups of fans with a flow axis perpendicular to the plane of the server enclosure but with opposite flow direction with the two groups vertically offset relative to each other. The two paths are separated from each other through dividers. Both paths intake coolant from the cold isle and exhaust the coolant to the hot isle. The non-volatile memory mass storage devices include electromechanical and solid state devices.

16 Claims, 6 Drawing Sheets

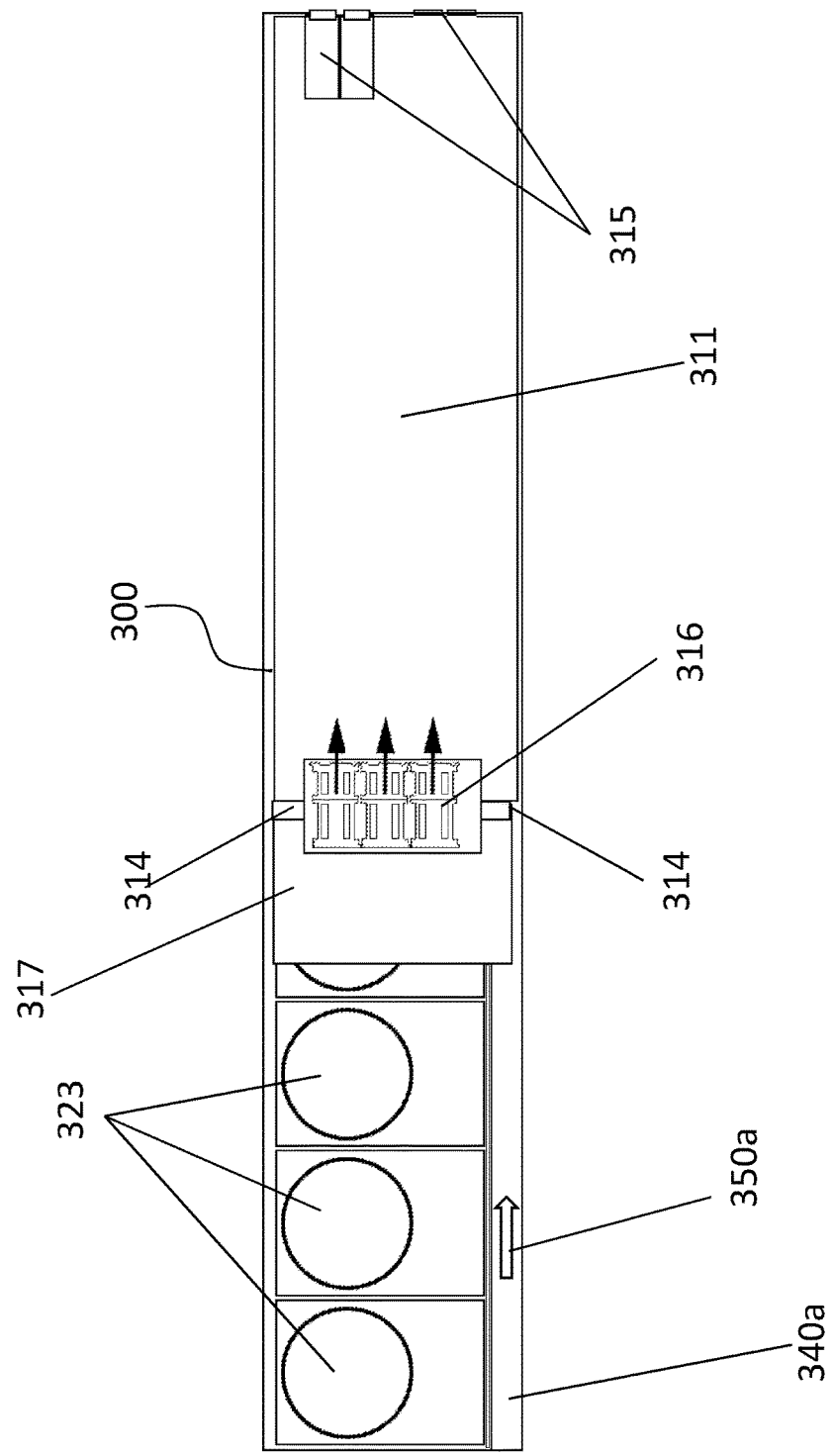

APPARATUSES AND METHODS FOR COOLING HIGH DENSITY ARRAYS OF NON-VOLATILE MEMORY MASS STORAGE DEVICES

CLAIM OF PRIORITY

The present application for patent claims priority to U.S. Provisional Application No. 62/488,049 entitled APPARATUSES AND METHODS FOR COOLING HIGH DENSITY ARRAYS OF NON-VOLATILE MEMORY MASS STORAGE DEVICES, filed Apr. 20, 2017 and which is hereby expressly incorporated by reference herein.

FIELD

The present disclosure generally relates to memory devices for use with server computers and other processing apparatuses. More particularly, the present disclosure relates to cooling of high density arrays of hard disk drives integrated into the server computers and/or other processing devices.

BACKGROUND

Hard disk drives (HDDs) using rotating media are a low-cost and robust solution for permanent storage of data. Current generations of HDDs exist in different form factors, with the 2.5" form factor prevailing in the mobile sector and the 3.5" form factor being the most common solution in desktop, server and workstation environments. The system interface of either of the above form factors may conform to the Serial Advanced Technology Attachment (SATA or Serial ATA) or the Serial Attached Small Computer System Interface (SAS), standard with the first being prevalent in the consumer market segment and the latter more commonly used in the enterprise market segment.

Contemporary high density storage servers are typically modular designs having a drive enclosure and provisions to plug in additional modules into a server or storage bay. The modules are typically server modules that connect to the outside world through Ethernet or Fibre Channel (FC) or else Input/Output (I/O) modules that interface with the outside world through SAS connections. The modules are also typically field-replaceable units (FRUs), whereas the drive enclosure is the main unit of the entire configuration and uses a base board (also referred to as base plane or drive plane) as an interface to the drives. The drives are inserted from the top of the enclosure, which is referred to as a top-loading configuration. Hard disk drives are using industry standard form factors, for example, the currently prevalent 3.5" drives are generally referred to as large form factor drives with standardized outside dimensions. Server enclosures are generally standardized with respect to their dimensions as well, therefore, any increase in the number of drives in the available space will result in the cannibalization or reduction of the space in between the drives with the caveat that that particular space serves as plenum for cooling fluids. Accordingly, increasing the number of drives in the enclosure will reduce the amount of cooling fluid available. In the majority of cases, the cooling fluid will be air.

Data centers are laid out in a way that rows of servers have their front end in an area receiving cold air from air conditioning units. The cold air is taken in by the servers and warms up when passing through the electronics. The hot air is expelled into an area that exhausts the hot air. The intake and exhaust areas of the data centers are generally referred to as hot and cold isles, respectively.

Turning to FIG. 1, a typical server enclosure 100 as used in most current designs is illustrated. The enclosure 100 has four different compartments, the first compartment 110 contains the actual server module having a motherboard 111, a microprocessor 112, memory modules 113 and input output (I/O) ports 115. A high density connector 114 connects the motherboard to a drive carrier board 121, located inside the drive bay 120. The drive carrier board 121 contains drive connectors 125 which may be a small form factor (SFF) 8639 (U2) or any other suitable form factor known in the art and into which the drives 123 are plugged.

The system power supply 131 is located in the power supply bay 130 and has an exhaust fan 136 to expel hot air into the hot isle. The coolant or air 150 is drawn in from the cold isle by an array of fans 146 located in a system fan bay 140 and gradually warms up while passing between the HDDs over the different components inside the server enclosure 100. For an array of drives with each drive dissipating heat, that means that the drives located further away from the cold air intake will be subjected to increasingly pre-warmed air which greatly reduces the cooling efficiency. Increasing the number of drives in the system at the expense of the available air gap will exacerbate the situation.

In view of the aforementioned problems relating to maintaining cooling efficiency across increased-density arrays of HDDs in enclosures, it is clear that alternative solutions are necessary.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one feature, a server computer in a data center having hot and cold isles is provided. The server computer comprises an enclosure having a first circuit board configured to interface through connectors with a plurality of non-volatile memory devices; a first compartment and a second compartment separated by an air duct, the first compartment having a first set of vents directed to a cold isle, the second compartment having a second set of vents directed to a hot isle; and a third compartment in the enclosure located underneath the first and second compartments forming a plenum open to the cold isle and the hot isle and porting to the air duct, the air duct having a plurality of fans for moving cooling fluid across the plurality of non-volatile memory devices.

According to one aspect, the plurality of fans comprise a first group of fans and a second group of fans and wherein with an axial orientation of the first and second groups of fans are normal to a plane of the first circuit board.

According to another aspect, the first group of fans has an opposite air flow direction compared to the second group of fans.

According to yet another aspect, the first group of fans and the second group of fans are arranged in an alternating sequence of air flow direction.

According to yet another aspect, the plurality of non-volatile memory devices are comprised of a first array of non-volatile memory devices in the first compartment and a second array of non-volatile memory devices in the second compartment; and wherein the first and second arrays of non-volatile memory devices form interstices between apposing surfaces.

According to yet another aspect, each of the first and second compartments have the non-volatile memory devices oriented in a normal orientation to the first circuit board.

According to yet another aspect, the interstices create a lattice of narrow channels; and wherein each narrow channel includes cooling fluid moved therein.

According to yet another aspect, wherein the cooling fluid is air.

According to yet another aspect, the first group of fans are configured to draw in the cooling fluid through the plenum facing the cold isle and exhausts the cooling fluid to the hot isle through the interstices of the second array of non-volatile memory devices in the second compartment.

According to yet another aspect, the second group of fans are configured to draw in cooling fluid from the cold isle through the interstices of the first array of non-volatile memory devices in the first compartment and exhausts the cooling fluid through the plenum into the hot isle.

According to yet another aspect, wherein the plurality of non-volatile memory devices include at least one of a hard disk drive, a SAS solid state drive and a NVMe solid state drive.

According to yet another aspect, wherein the first circuit board is a drive carrier board.

According to yet another aspect, the first compartment includes a first set of vents directed to the cold isle; and wherein the second compartments includes a second set of vents directed to the hot isle.

According to yet another aspect, the second compartment further comprises a pair of server assemblies where each server assembly in the pair of server assemblies includes a motherboard, a microprocessor, memory modules and input/output interfaces.

According to yet another aspect, the computer server further comprises a personality card connected by high speed connectors or high pin-count signal connectors to the motherboard; and wherein the enclosure further includes an axial fan for moving the cooling fluid across the motherboard.

According to another feature, a method for cooling a server computer, having an enclosure and logic components, in a data center, having hot isles and cold isles is provided. The method comprises interfacing a first circuit board through connectors with a plurality of non-volatile memory devices; separating a first compartment with a second compartment, wherein the first and second compartments are separated by an air duct; directing a first set of vents to a cold isle in the first compartment; directing a second set of vents to a hot isle in the second compartment; forming a plenum open to the cold isle and the hot isle for porting to the air duct, the plenum formed by a third compartment underneath the first and second compartments; and moving cooling fluid through the air duct with a plurality of fans, the plurality fans comprising a first group of fans and a second group of fans with an axial orientation normal to the plane of the first circuit board, and wherein the first and the second groups of fans have opposite air flow direction.

According to an aspect, the method further comprises forming interstices between apposing surfaces of a first array of non-volatile memory devices in the first compartment formed from the plurality of non-volatile memory devices and a second array of non-volatile memory devices in the second compartment formed from the plurality of non-volatile memory devices; and creating a lattice of narrow channels, where each narrow channel includes at least a portion of the cooling fluid moved therein.

According to another aspect, the method further includes drawing in the cooling fluid, using the first group of fans, through the plenum facing the cold isles; exhausting the cooling fluid to the hot isle through the interstices of the non-volatile memory devices in the second compartment; drawing in the cooling fluid from the cold isle, using the second group of fans, through interstices of the non-volatile memory devices in the first compartment; and exhausting the cooling fluid through the plenum into the hot isle.

BRIEF DESCRIPTION OF THE DRAWINGS

FIG. 3 illustrates a side view of the server computer from FIG. 2A.

DETAILED DESCRIPTION

Figure 1:
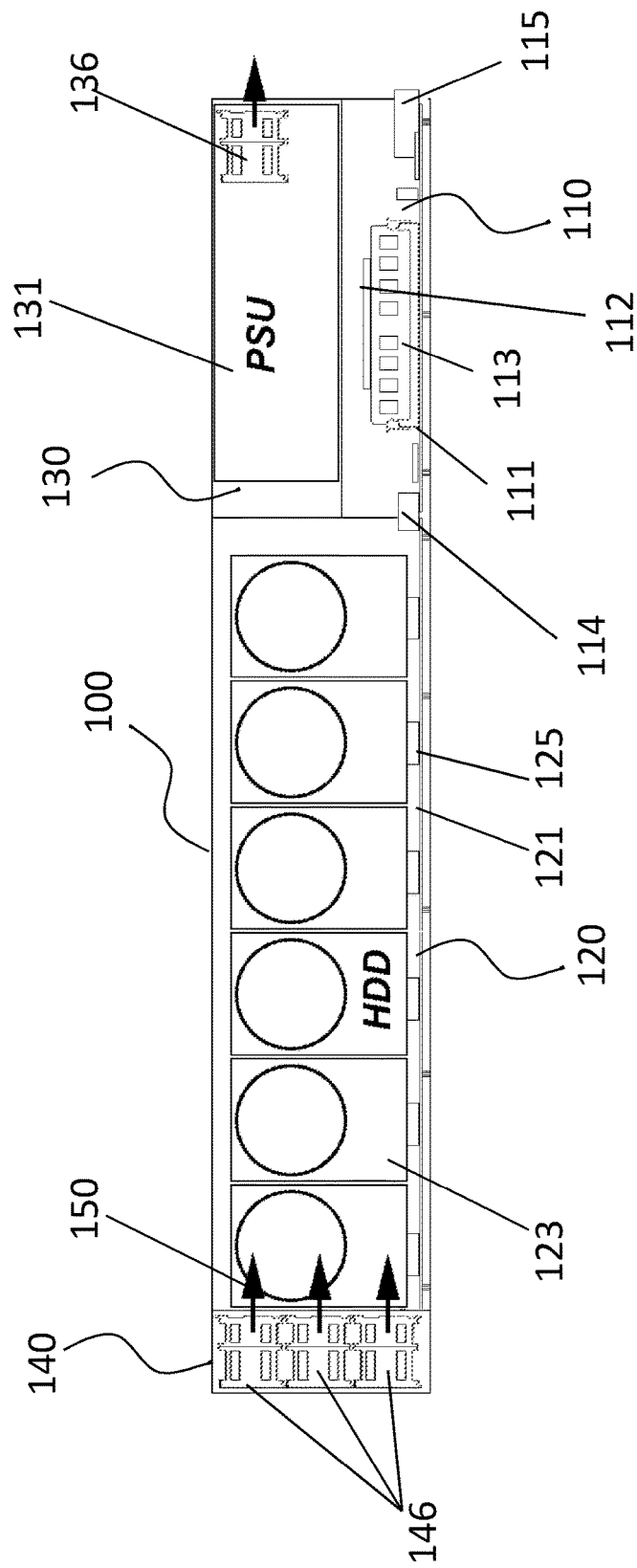
FIG. 1 illustrates a configuration of a standard server known in the art.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details.

In the following description, certain terminology is used to describe certain features of one or more embodiments. The term "non-volatile memory device" may refer to a hard disk drive (HDD), a solid state drive (SSD), or any type of device for storing data. Additionally, the term "non-volatile memory device" may refer to other technologies, such as non-volatile memory express (NVMe) technology, for storing data on non-volatile memory devices.

The present disclosure is directed to solving the problems of cooling non-volatile memory devices in a server (or other enclosure) or Just a Bunch of Disks (JBOD) enclosure. The term JBOD is used here to encompass any permutations describing a plurality of non-volatile memory or mass storage devices regardless of whether they are spinning media or hard disk drives or else flash (sometimes referred to as just a bunch of flash or JBOF), or any other type of non-volatile memory including but not limited to 3D CrosssPoint (3DXP), phase change memory (PCM), resistive memory (ReRAM; RRAM), various permutations of magnetic memory (MRAM), graphene-based and optical memories.

Overview

Increasing device numbers in the same physical volume of a storage enclosure can only be achieved by reducing the space between the individual devices in the enclosure. In turn, this decreases the width of the cooling channels between the devices, while at the same time the increased number of devices results in higher overall power density and heat dissipation. Reduced cooling channel width or cross-sectional area increases the impedance of the coolant moving through the channels, and results in a greater pressure drop from the front to the end of the enclosure, thereby also reducing the overall volume of the coolant that can pass through the channels.

One solution to overcome the pressure drop in the coolant path is to split the array of non-volatile memory devices into several sub-arrays with their own private cooling subsystems. However, air ducts and fan space are expensive real estate, especially if the overall goal is an increase in number of storage devices. An additional handicap stems from the fact that axial fans need a certain clearance on their egress side to develop a flow field. Disregarding this particular requirement typically results in greatly reduced efficiency and performance of the fans.

One feature pertains to cooling of a high density array of non-volatile memory mass storage devices within a computer enclosure. A coolant is moved through the enclosure through two separate air paths, each serving approximately half of the mass storage devices. The two air paths are interleaved in a central duct ported to a frontal and a rear plenum. The central duct contains two groups of fans with a flow axis perpendicular to the plane of the server enclosure but with opposite flow direction with the two groups vertically offset relative to each other. The two paths are separated from each other through dividers. Both paths intake coolant from the cold isle and exhaust the coolant to the hot isle. The non-volatile memory mass storage devices include electromechanical and solid state devices.

Server Computer

Figure 2A:
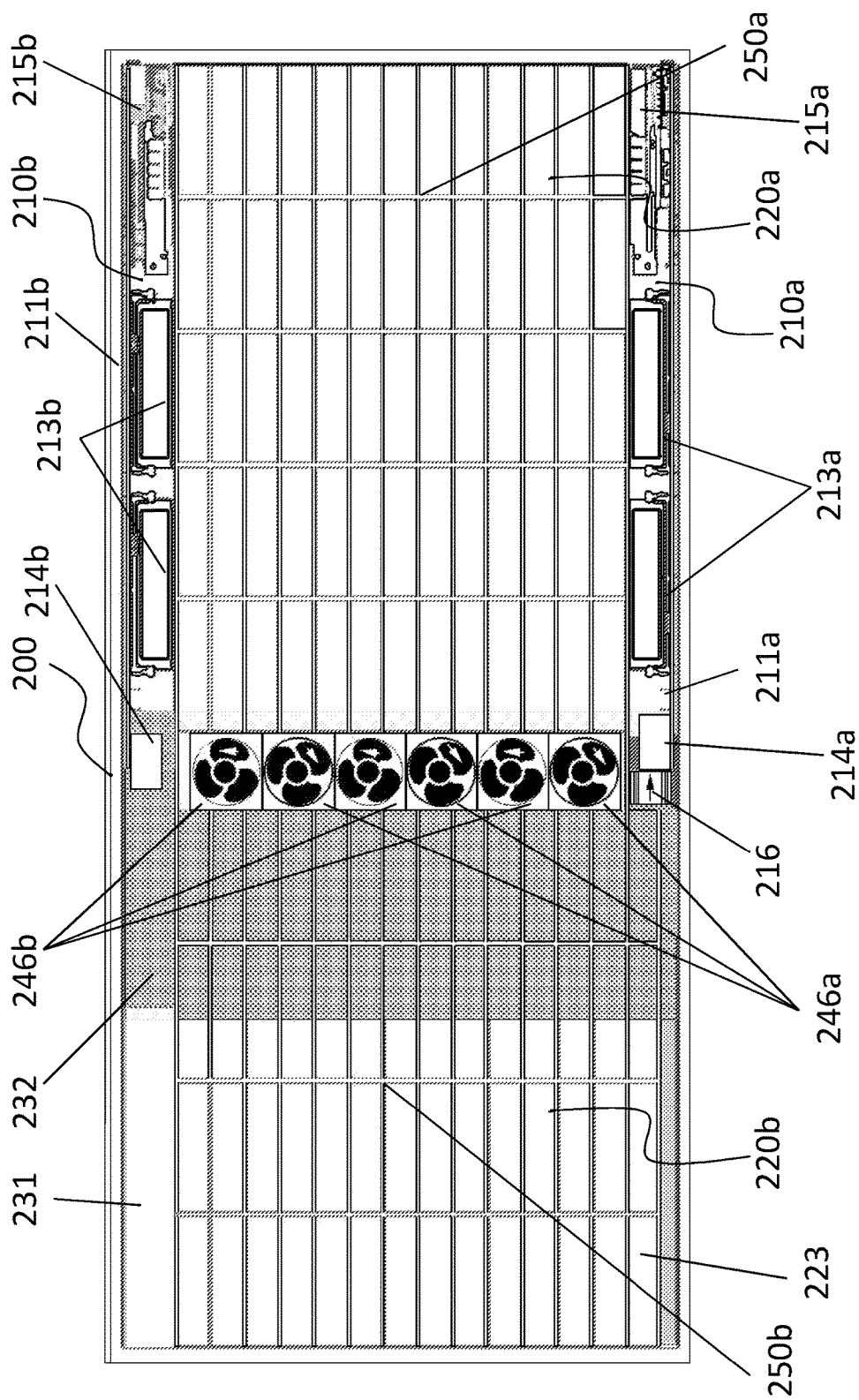
FIG. 2A illustrates a top view of a server computer having a cooling system according to one aspect of the present disclosure.
Figure 2B:
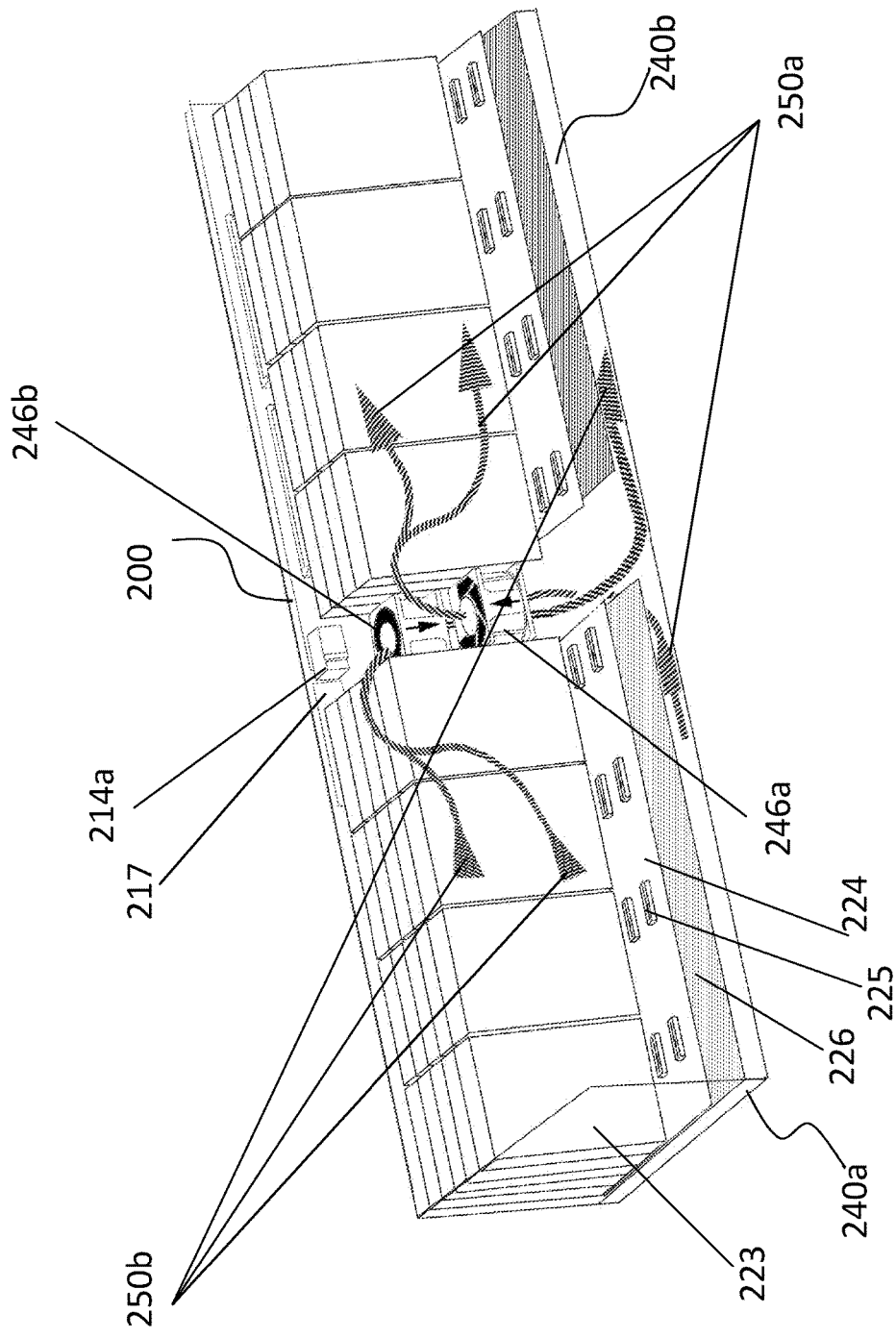
FIG. 2B shows an isometric cut view of the server computer of FIG. 2A.

FIG. 2A illustrates a top view of a server computer 200 which provides a cooling system for efficiently cooling across increased-density arrays of HDDs in the server computer 200, according to one aspect of the present disclosure. FIG. 2B illustrates an isometric cut view of the computer server of FIG. 2A. While a computer server is illustrated in FIGS. 2A and 2B, this is by way of example only and the cooling system of the present disclosure may be utilized in any type of enclosure having increased-density arrays HDDs or other types of devices that require cooling.

As shown, the server computer 200 has a novel arrangement of fans and airways which circumvent the restrictions described above. The server computer 200, which may include an enclosure and logic components, may be used in a data center with hot isles and cold isles. The enclosure of the server computer 200 may include a first circuit board 224 configured as a drive carrier board, for example, to interface through connectors 225 with non-volatile memory devices 223. Additionally, a first compartment 220b and a second compartment 220a may be separated by an air duct, wherein the first compartment 220b has vents directed to the cold isle and the second compartment 220a has vents directed to the hot isle. The first and second compartments 220b, 220a may each have a non-volatile memory device 223, wherein the non-volatile memory devices are oriented in a substantially normal orientation to the first circuit board 224.

The enclosure of the server computer 200 may further include a third compartment comprising a front portion (forming a second air duct) 240a and a rear portion (forming a first air duct) 240b underneath the first and the second compartments 220b, 220a and separated from the first and the second compartments 220b, 220a by sheet metal 226 forming a plenum, which may be open at the front end and the back end of the enclosure of the server computer 200 to the cold isle and the hot isle, respectively. The plenum may be ported to the air ducts. According to one aspect, the air ducts may include fans 246a, 246b, for moving cooling fluid (or coolant). The fans 246a, 246b may comprise a first group of fans 246a and a second group of fans 246b, each group of fans having an axial orientation normal to the plane of the first circuit board 224. According to one aspect, the first group of fans 246a and the second group of fans 246b may have opposite air flow direction. In addition, the first and second group of fans 246a, 246b may be arranged in an alternating sequence.

In yet another aspect of the present disclosure, as shown in FIG. 2A, a method for cooling a server with a high density array of non-volatile memory devices is provided. The method uses a novel arrangement of fans and airways in a server 200, which may circumvent the restrictions imposed by increasing the array density of non-volatile memory devices. As mentioned previously, the first compartment 220b may be facing the cold isle and the second compartment 220a may be facing the hot isle. Both compartments 220b, 220a may include a plurality of non-volatile memory devices 223 forming interstices between their apposing surfaces and creating a lattice of narrow channels, each of which contains cooling fluid (or coolant) 250a, 250b. According to one aspect, the cooling fluid may be air. Alternatively, the cooling fluid may be other types of gas. The second compartment 220a facing the hot isle (i.e. the hot isle-facing compartment) may further include two server assemblies 210a and 210b, respectively, each having a motherboard 211a and 211b, respectively, a microprocessor, memory modules 213a, 213b and input/output interfaces 215a, 215b. The interface to a personality card 217 may be provided by connectors such as high speed connectors or high pin-count signal connectors 214a (See FIG. 2B), and 214b (See FIG. 2A). An axial fan 216 in the enclosure may move the cooling fluid (or coolant) 250a, 250b across the motherboards 211a, 211b. Power may be provided by an integrated power supply unit 231 having its own fan (not illustrated) for cooling of its internal components.

In another aspect of the disclosure, the first group of fans 246a may draw in fluid from the cold isle through the plenum of the third compartment facing the rear portion forming a first air duct 240a, and exhaust the fluid 250a to the hot isle through the interstices of the non-volatile memory devices in the second compartment 220a. The second group of fans 246b may draw in fluid from the cold isle through the interstices of the non-volatile memory devices in the first compartment 220b and exhaust the fluid 250b through the rear portion of the plenum 240b forming the second air duct 240b into the hot isle.

In a preferred embodiment, a row of fans may be arranged approximately in the middle of the enclosure of the server computer 200. The fans may be oriented with a flow axis normal to the main plane of the enclosure of the server computer 200 and in alternating flow directions such that one group of fans move air from top to bottom and the other group of fans move air in the opposite direction. As shown in FIG. 2B, the group of fans blowing downward 246b may be shifted towards the top of the enclosure of the server computer 200 and the group of fans blowing upward 246a may be moved further towards the bottom of the enclosure of the server computer 200, leaving enough space at the fan's egress to develop an unobstructed flow field. The drive carrier board 224 may be segmented into a frontal and a rear part and mounted on a shelf of sheet metal 226 forming the first and second air ducts 240a, 240b with the bottom of the enclosure.

The cooling fluid may be moved through two separate air ways, wherein the first air way draws in fluid 250a from the cold isle through the frontal portion of the first air duct 240a, moves it upwards and then disposes it through the gaps between the non-volatile memory devices into the hot isle. The second air way draws in fluid 250b from the cold isle and moves it through the gaps between the non-volatile memory devices to the central air duct where it is disposed through the rear portion of the bottom plenum 240b, i.e. the second air duct, into the hot isle.

In one particular aspect the central air duct containing the fans may be divided into several discrete air channels by separators between the individual fans. The separators may prevent recirculation of coolant through the fans and may be configured in the shape of a scoop to facilitate redirection of the airflow from a vertical to a horizontal direction.

FIG. 3 shows another aspect of the present disclosure in a cut side view of a computer server 300 to illustrate the spatial relationship between the drive bay containing non-volatile memory components 323, a lower plenum 340a, the coolant 350a drawn in through the lower plenum 340a from the cold isle, and a motherboard 311 connected through connectors 314 with a personality card 317. In the particular arrangement shown, the motherboard fans 316 may be positioned in a cut-away of the motherboard 311 and personality card 317 to conserve z-height. Connectivity to the outside world may be enabled through the use of I/O connectors 315.

Figure 4:
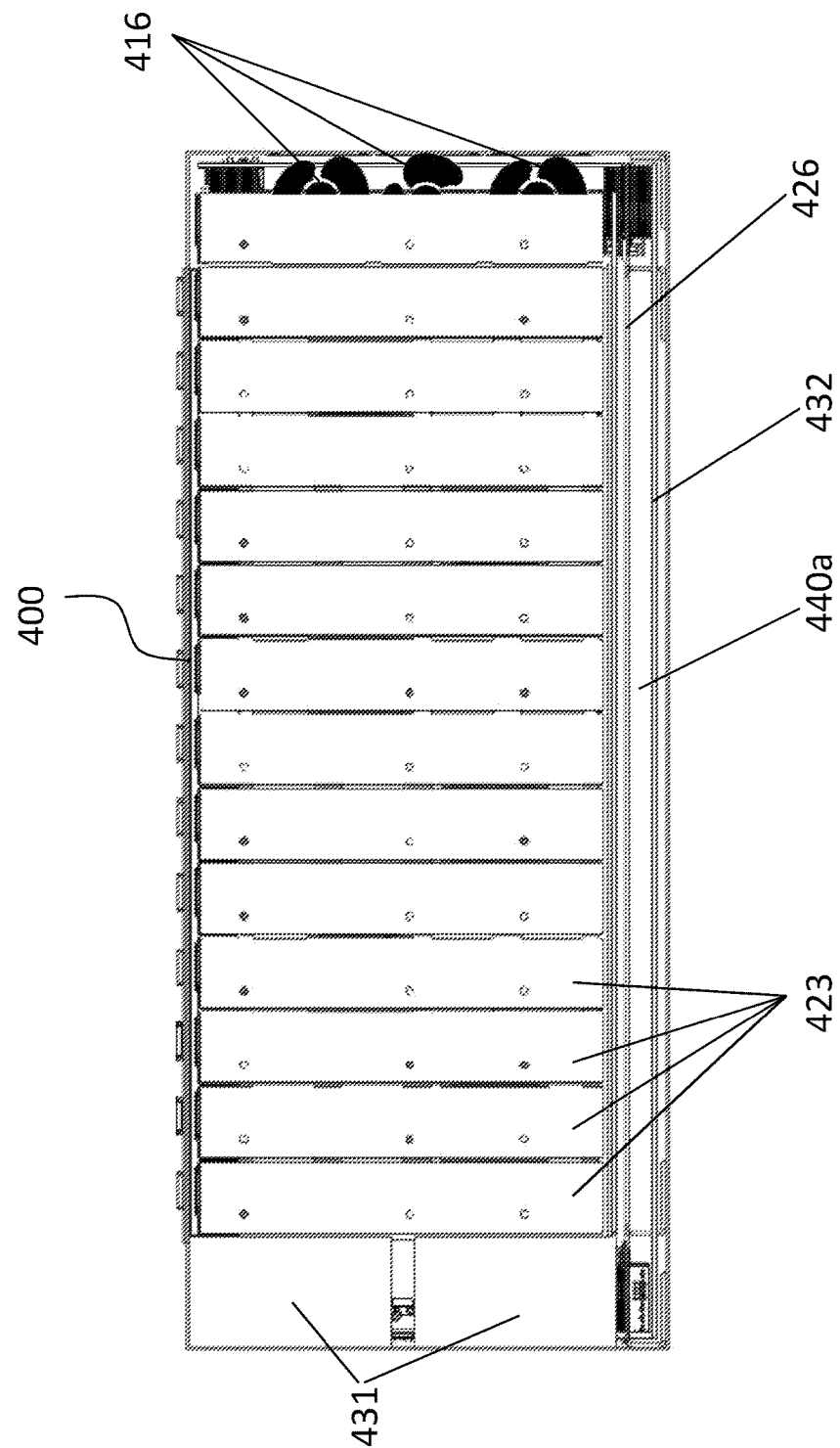
FIG. 4 illustrates a front view of the server computer from FIG. 2A.

FIG. 4 shows a front view of a server computer 400 of the present disclosure facing the cold isle, with non-volatile memory devices 423 forming a tight lattice of cooling channels. As shown, dual power supply units 431 may provide n+1 redundancy. The motherboard and its components in the server computer 400 may be cooled through the use of CPU-fans 416 located in the cut-away between the motherboard and the personality card, however, other CPU fan arrangements are possible and any type of fan arrangement known in the art may be utilized. A shelf of sheet metal 426 may separate a lower plenum 440a from the upper enclosure. The lower plenum 440a may also contain a 5V regulator board 432 for generating 5V power for certain non-volatile memory devices.

Figure 5:
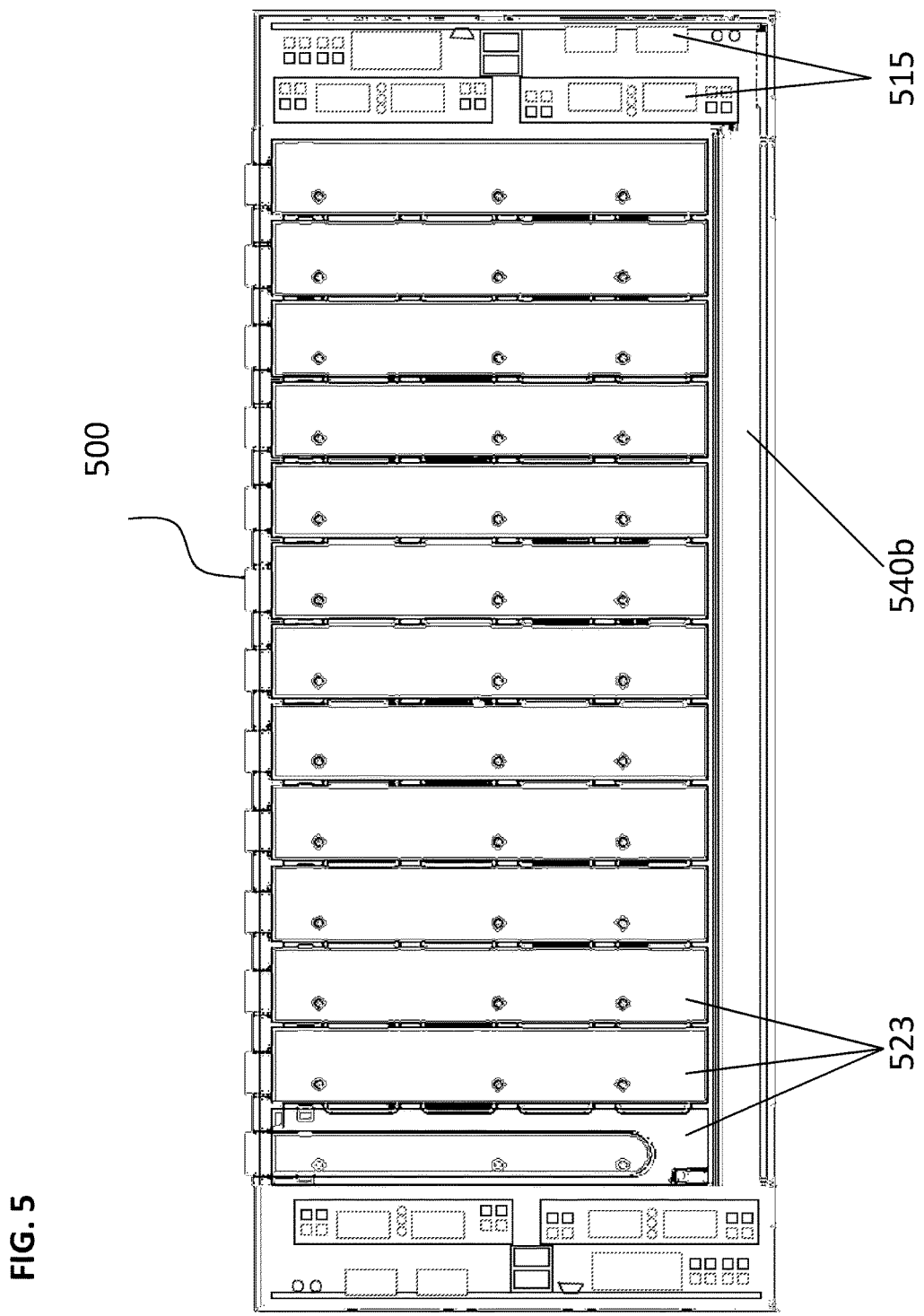
FIG. 5 illustrates a rear view of the server computer from FIG. 2A.

FIG. 5 shows the rear perspective of a server computer 500 of the present disclosure facing the hot isle. Hot air may be exhausted through the gaps between nonvolatile memory devices 523 and the rear-facing portion of a lower plenum 540b. In the example shown, the two motherboards may stand on their edges with the logic components facing inwards. Alternatively, the two motherboards may also be installed in the same orientation instead of facing each other. The I/O connectors 515 may be secured through perforated panels providing additional exhaust openings while containing electromagnetic interference emission.

While the present disclosure has been described in form of specific and preferred embodiments and form factors, it is foreseeable that functionally equivalent designs could be used or subsequently developed to perform the intended functions of the tiled architecture. For example, different types of fan may be implemented to move the coolant through the central air duct, non-limiting examples include axial and centrifugal fans. Also, the disclosure has been described in exemplary form for an enclosure with top-loading drives, however, it is generally applicable to any drive-mounting configuration, for example side- or front-mounting drives. Likewise, the drives used as non-limiting examples for the description of the disclosure are hard disk drives, however, any storage media such as solid state drives are included regardless of whether they have conventional form factors or conform to some of the emerging form factors such as Next Generation Small Form Factor (NGSFF), (Enterprise and Datacenter SSD Form Factor EDSFF) or others. Therefore, it is apparent that other forms could be adopted by one skilled in the art. Finally, while the appended claims recite certain aspects believed to be associated with the invention and investigations discussed above, they do not necessarily serve as limitations to the scope of the invention.

Method

The present disclosure provides a method for cooling high density arrays of non-volatile memory mass storage devices. The computer service may be located in a data center and comprise an enclosure and logic components as well as hot isles and cold isles as described above.

In the method, a first circuit board may be interfaced through connectors with a plurality of non-volatile memory devices and a first compartment may be separated by a second compartment using air ducts. Furthermore, a first set of vents may be directed to a cold isle in the first compartment and a second set of vents may be directed to a hot isle in the second compartment.

Next, a plenum open to the cold isle and the hot isle is formed for porting to the air ducts. The plenum may be formed by a third compartment underneath the first and second compartments. A cooling fluid, such as air or any other cooling fluid known in the art, may be moved through the air ducts with a plurality of fans. According to one aspect, the plurality of fans may comprise a first group of fans and a second group of fans with an axial orientation normal to the plane of the first circuit board, and the first and the second groups of fans have opposite air flow direction.

The method may further comprise forming interstices between apposing surfaces of a first array of non-volatile memory devices in the first compartment formed from the plurality of non-volatile memory devices and a second array of non-volatile memory devices in the second compartment formed from the plurality of non-volatile memory devices. A lattice of narrow channels may be recreated where each of the narrow channels includes at least a portion of the cooling fluid moved therein.

The method may further comprise drawing in the cooling fluid, using the first group of fans, through the plenum facing the cold isles and exhausting exhausting the cooling fluid to the hot isle through the interstices of the non-volatile memory devices in the second compartment. Alternatively or in addition to, the method may comprise drawing in the cooling fluid from the cold isle, using the second group of fans, through interstices of the non-volatile memory devices in the first compartment and exhausting the cooling fluid through the plenum into the hot isle.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

Accordingly, the various features associate with the examples described herein and shown in the accompanying drawings can be implemented in different examples and implementations without departing from the scope of the disclosure. Therefore, although certain specific constructions and arrangements have been described and shown in the accompanying drawings, such implementations are merely illustrative and not restrictive of the scope of the disclosure, since various other additions and modifications to, and deletions from, the described implementations will be apparent to one of ordinary skill in the art. Thus, the scope of the disclosure is only determined by the literal language, and legal equivalents, of the claims which follow.

What is claimed is:

1. A server computer in a data center having hot and cold isles, the server computer comprising: an enclosure having a first circuit board configured to interface through connectors with a plurality of non-volatile memory devices; a first compartment and a second compartment separated by an air duct, the first compartment having a first set of vents directed to a cold isle, the second compartment having a second set of vents directed to a hot isle; and a third compartment in the enclosure located underneath the first and second compartments forming a plenum open to the cold isle and the hot isle and porting to the air duct, the air duct having a plurality of fans for moving cooling fluid across the plurality of non-volatile memory devices; wherein the plurality of fans comprise a first group of fans and a second group of fans; and wherein an axial orientation of the first and second groups of fans is normal to a plane of the first circuit board; and wherein the first group of fans has an opposite air flow direction compared to the second group of fans.

2. The server computer of claim 1, wherein the first group of fans and the second group of fans are arranged in an alternating sequence of air flow direction.

3. The server computer of claim 1, wherein the plurality of non-volatile memory devices are comprised of a first array of non-volatile memory devices in the
   first compartment and a second array of non-volatile memory devices in the second compartment; and
   wherein the first and second arrays of non-volatile memory devices form interstices between opposing surfaces.

4. The server computer of claim 3, wherein each of the first and second compartments have the non-volatile memory devices oriented in a normal orientation to the first circuit board.

5. The server computer of claim 3, wherein the interstices create a lattice of narrow channels; and wherein each narrow channel includes cooling fluid moved therein.

6. The server computer of claim 1, wherein the cooling fluid is air.

7. The server computer of claim 4, wherein the first group of fans are configured to draw in the cooling fluid through the plenum facing the cold isle and exhausts the cooling fluid to the hot isle through the interstices of the second array of non-volatile memory devices in the second compartment.

8. The server computer of claim 4, wherein the second group of fans are configured to draw in cooling fluid from the cold isle through the interstices of the first array of non-volatile memory devices in the first compartment and exhausts the cooling fluid through the plenum into the hot isle.

9. The server computer of claim 1, wherein the plurality of non-volatile memory devices include at least one of a hard disk drive, a SAS solid state drive and a NVMe solid state drive.

10. The server computer of claim 1, wherein the first circuit board is a drive carrier board.

11. The server computer of claim 1, wherein the first compartment includes a first set of vents directed to the cold isle; and wherein the second compartments includes a second set of vents directed to the hot isle.

12. The server computer of claim 1, wherein the second compartment further comprises a pair of server assemblies where each server assembly in the pair of server assemblies includes a motherboard, a microprocessor, memory modules and input/output interfaces.

13. The server computer of claim 12, further comprising a personality card connected by high speed connectors or high pin-count signal connectors to the motherboard; and wherein the enclosure further includes an axial fan for moving the cooling fluid across the motherboard.

14. A method for cooling a server computer, having an enclosure and logic components, in a data center, having hot isles and cold isles, the method comprising:
   interfacing a first circuit board through connector with a plurality of non-volatile memory devices;
   separating a first compartment with a second compartment, wherein the first and second compartments are separated by air ducts;
   directing a first set of vents to a cold isle in the first compartment;
   directing a second set of vents to a hot isle in the second compartment;
   forming a plenum open to the cold isle and the hot isle for porting to the air ducts, the plenum formed by a third compartment underneath the first and second compartments; and
   moving cooling fluid through the air ducts with a plurality of fans, the plurality fans comprising a first group of fans and a second group of fans with an axial orientation normal to the plane of the first circuit board, and wherein the first and the second groups of fans have opposite air flow direction.

15. The method of claim 14, further comprising:
   forming interstices between apposing surfaces of a first array of non-volatile memory devices in the first compartment formed from the plurality of non-volatile memory devices and a second array of non-volatile memory devices in the second compartment formed from the plurality of non-volatile memory devices; and
   creating a lattice of narrow channels, where each narrow channel includes at least a portion of the cooling fluid moved therein.

16. The method of claim 15, further comprising:

drawing in the cooling fluid, using the first group of fans, through the plenum facing the cold isles;

exhausting the cooling fluid to the hot isle through the interstices of the non-volatile memory devices in the second compartment;

drawing in the cooling fluid from the cold isle, using the second group of fans, through interstices of the non-volatile memory devices in the first compartment; and exhausting the cooling fluid through the plenum into the hot isle.

\* \* \* \* \*